United States Patent [19]
Brown

[11] Patent Number: 5,377,144
[45] Date of Patent: Dec. 27, 1994

[54] MEMORY ARRAY RECONFIGURATION FOR TESTING

[75] Inventor: David R. Brown, Sugar Land, Tex.

[73] Assignee: Texas Instruments Inc., Dallas, Tex.

[21] Appl. No.: 97,820

[22] Filed: Jul. 27, 1993

[51] Int. Cl.⁵ ............................................. G11C 7/00
[52] U.S. Cl. ............................. 365/189.02; 365/201; 365/230.02
[58] Field of Search ............ 365/63, 189.2, 200, 365/201, 230.2, 230.8, 230.3, 230.03, 230.08, 189.02

[56] References Cited

U.S. PATENT DOCUMENTS

| | | | |
|---|---|---|---|
| 4,873,669 | 10/1989 | Furutani | 365/201 X |
| 5,079,747 | 1/1992 | Nakada | 365/201 X |
| 5,089,993 | 2/1992 | Neal | 365/63 |
| 5,185,720 | 2/1993 | Vaillancourt | 365/189.2 |
| 5,208,778 | 5/1993 | Kumanoya | 365/201 |
| 5,220,518 | 6/1993 | Haq | 365/200 X |
| 5,228,132 | 7/1993 | Neal | 365/63 X |

FOREIGN PATENT DOCUMENTS 0239679  10/1988  Japan .................................. 365/201

*Primary Examiner*—Eugene R. LaRoche
*Assistant Examiner*—Son Mai
*Attorney, Agent, or Firm*—William W. Holloway; Lawrence J. Bassuk; Richard L. Donaldson

[57] ABSTRACT

A memory part (10), with memory (14) subarrays arranged in different ways, provides one data input and output path for normal operation and another data input and output path for test mode operation. The part furnishes one data output multiplexer (40) connected between the memory (14) subarrays and the data output buffers (24) for normal operation. The part furnishes another data output multiplexer (52) connected between the memory (14) subarrays and the data output buffers for test mode operation. Test mode circuits (30) on the memory part select operation of the one and the other multiplexer. Data input gating circuits connect between the data in buffers (22) and the memory (14) subarrays and connect all or one of the data input leads D0-8 to the memory subarrays in response to operation of the test mode circuits.

8 Claims, 3 Drawing Sheets

MEMORY ARRAY RECONFIGURATION FOR TESTING

FIELD OF THE INVENTION

This invention relates to testing semiconductor memory devices formed as integrated circuits on semiconductor substrates and particularly relates to reconfiguring the data input and output paths to simplify testing of the memory arrays, especially where one of the arrays is configured for normal operation as a parity array.

DESCRIPTION OF THE RELATED ART

Semiconductor memory parts must be tested after fabrication to eliminate unrepairable parts and identify parts that can be repaired by use of redundancy circuits. This procedure occurs in a normal process of manufacturing. This testing is time consuming and the test fixtures and equipment used for testing are expensive. In memory parts capable of storing millions of bits, the time and equipment expenses become large portions of the cost of manufacturing. In such parts, every addressable location in the memory array must have a bit written to it and read from it to ascertain that the part operates correctly.

Semiconductor memory parts generally and dynamic random access memories, DRAMs, in particular often contain a large array of memory cells subdivided into several separate, equally sized and internally addressable subarrays of equal size. Dividing the array into subarrays facilitates manufacturing the parts. These subarrays of memory cells all have the same or like internal address leads connected to them so that each subarray is accessed in a like manner. The subarrays thus are bitmapped alike. Internal test circuits can then test all of the subarrays in parallel from simple inputs received from a test fixture. The internal circuits also provide simple test results to the test fixture. This parallel testing scheme helps reduce the time and cost of testing.

Some semiconductor memory parts contain an array of memory cells with unequally divided subarrays, or have subarrays receiving address leads unlike the rest of the subarrays. An example of such parts could be a parity part, configured to store 512K (524,288) words of information by 9 bits per word. The 9 bits of each word provide 8 bits of data and 1 bit of parity information. Such a part contains 8 like subarrays each containing 512K bits, corresponding to the 8 bits of data, and two other subarrays of 256K bits each containing one bit for each of the addressable words of data. The two other subarrays are addressed differently than the 8 like subarrays. The data and parity subarrays thus are bitmapped differently.

Similar configurations occur in other memory parts arranged, for example, in 256K words by 18 bits; these parts provide 256K words of 16 data bits and 2 bits of parity for each data word.

In these parts with differently bitmapped subarrays, the parts contain specific row and column address lead connection and intermediate I/O line decoding to obtain desired normal operation. Particularly the intermediate I/O line decoding for the data subarrays stands different from the decoding for the parity subarray. Of course the designer has the flexibility to implement any decoding desired for these special purpose parts.

Testing the parts with unequal or differently bitmapped subarrays has required application of two different test patterns to the parts; one test pattern for the 8 like data subarrays and another pattern for the parity subarray. This costs test time and complicates the test fixture.

SUMMARY OF THE INVENTION

The present invention reduces test time and fixture cost by presenting two different data paths between the data input and output leads and the array of memory cells. One data path effects normal operation of the part and uses all of the data input and output leads. The other data path becomes selected during testing and uses less than all of the data input and output leads. In effect, the part in normal operation bitmaps the memory array one way and for testing bitmaps the memory array another way.

Specifically the invention furnishes a second multiplexer or decoder of the intermediate I/O lines between the memory array and the data output buffers. A first multiplexer or decoder between the memory array and the data output buffers operates in the normal mode and the second multiplexer operates during testing. The provision of these two multiplexers changes the apparent bitmapping of the memory array in the test mode.

The invention also furnishes gating of the data lines between the data input buffers and the memory array to change the input data path during testing; in the test mode, only one data input lead is active and data received on that one lead is gated to all of the subarrays of the memory array.

In the test mode, test mode circuits on the semiconductor change the apparent configuration of the memory subarrays from 8 data and 1 parity subarrays to 5 subarrays. Write data is received on one data input lead and read data is presented on five data output leads.

DETAILED DESCRIPTION

Figure 1:
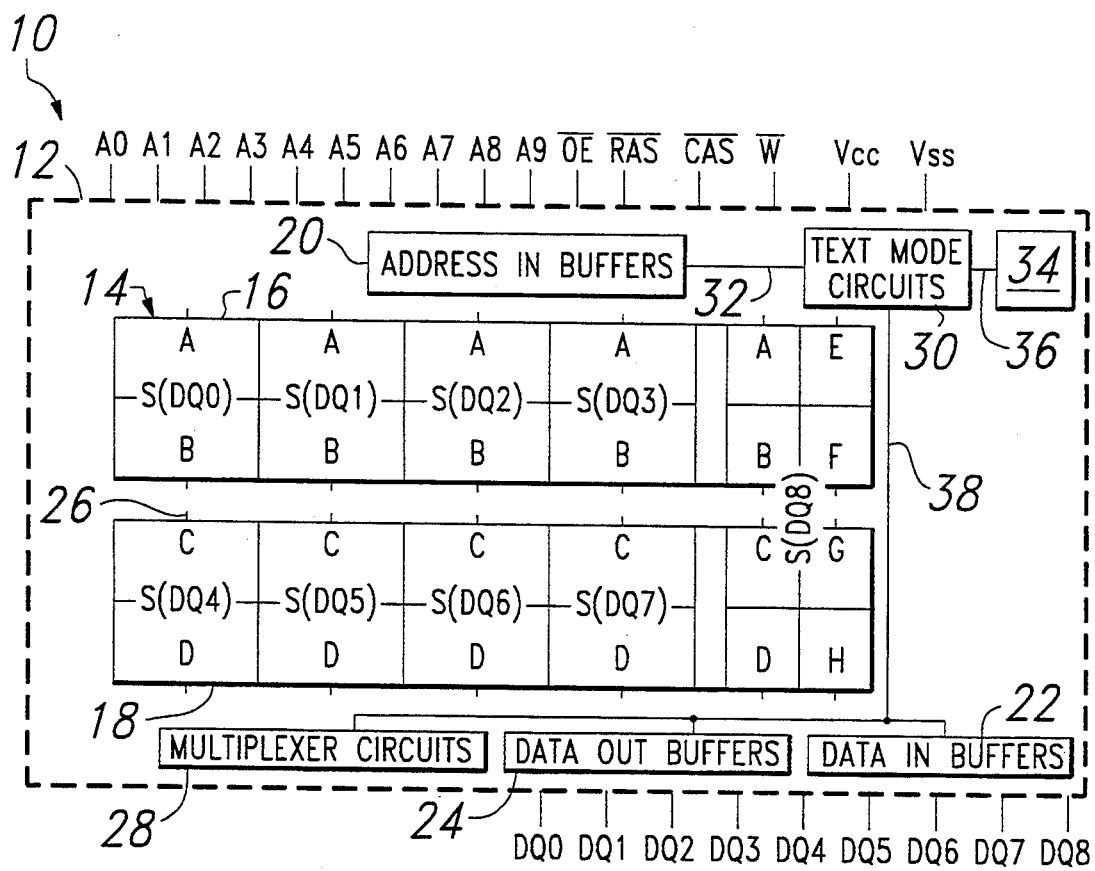
FIG. 1 is an idealized block diagram of a semiconductor integrated circuit memory part incorporating the present invention and depicting one bitmapped representation of the memory array.

Memory part 10 comprises a packaged semiconductor integrated circuit formed on a substrate 12. Referring to FIG. 1, memory part 10 provides an array 14 of memory cells arranged in an upper-half 16 and a lower-half 18.

Memory part 10 receives address signals A0 through A9 at address in buffers 20. Address in buffers 20 also receive the row address strobe_ (RAS_), column address strobe_ (CAS_), output enable_ (OE_), and write_ (W_) signals. Address in buffers 20 produce address signals internally for memory part 10 for selecting desired memory cells. Electrical power is applied to the part in the form of positive voltage Vcc and reference Vss.

Memory part 10 receives data bits DQ0 through DQ8 at data input leads and applies these data bits to data in buffers 22 and produces data bits DQ0 through DQ8 at data out buffers 24 and the data out buffers 24 apply these data bits to data output leads. The respective bit lines connect to individual bond pads and lead fingers to effect a set of nine bi-directional data lines to and from the memory part 10.

Memory part 10 forms a Dynamic Random Access Memory, DRAM, arranged to read and write 512K words with each word containing eight bits of data, DQ0 through DQ7, and one bit of parity information, DQ8. In this description, the capital letter D refers to data being written to the memory array 14 while the letter Q refers to data being read from the memory array 14. A combination of the two letters, DQ, refers to the bit that can be either written or read. One skilled in the art will understand that memory part 10 contains many other circuits that are not depicted, that are necessary or desirable for operation of a DRAM, and that are well known.

Memory array 14 could have been constructed and arranged in a single large matrix of memory cells with all of the bits of each addressed word physically next to one another and each sequential word physically next to the preceding and following words. That arrangement of the memory matrix however results in an unusually large substrate of semiconductor material and a substrate that is difficult to package. Present DRAM parts obtain substrates that are easier to package and of smaller size by dividing the memory array into subarrays and blocks of subarrays, as may be desired.

Further, a block diagram representation of a memory part containing millions of memory cells necessarily ignores much detail to provide useful explanation. A block diagram of the memory array 14 arranged to depict mapping of the data word bits thus must ignore some of the physical arrangement of the memory cells into subarrays and further sub-subarrays, and must ignore some of the details of the addressing of those subarrays and sub-subarrays. The division of the memory cells into addressable groups has previously risen to high levels of accomplishment, and an idealized depiction of the memory array adequately provides an explanation for the claimed invention.

Memory array 14 thus provides an upper-half 16 furnishing subarrays S(DQ0), S(DQ1), S(DQ2), and S(DQ3). Lower-half 18 furnishes subarrays S(DQ4), S(DQ5), S(DQ6), and S(DQ7). Each of these subarrays further furnish two blocks identified as A or B or identified as C or D. These subarrays are of equal size and in the present embodiment present one 1K (1024) rows with each row extending vertically of the page. Each subarray also presents 512 columns with each column extending horizontally of the page. Block A of subarray S(DQ0) thus presents 1K rows by 256 columns, and block B of subarray S(DQO) thus presents 1K rows by 256 columns. One memory cell exists at the intersection of one row and one column.

In addition, array 14 furnishes an additional subarray S(DQ8). Subarray S(DQ8) contains the same number of memory cells as the other subarrays but is broken in half and rearranged into the top and bottom halves 16 and 18 to obtain a memory part 10 of minimal size. Subarray S(DQ8) contains blocks A through H. Subarray S(DQ8) presents 512K addressable bit positions arranged with 512 rows extending vertically through blocks A, B, E, and F and an additional 512 rows extending vertically through blocks C, D, G, and H. Subarray S(DQ8) contains 1K columns with 512 columns extending horizontally through blocks A, E, B, and F and 512 columns extending horizontally through blocks C, G, D, and H. While each of subarrays (DQ0) through S(DQ0) are thus arranged 1K rows by 512 columns, array S(DQ8) is arranged 512 rows by 1024 columns. This difference is one of the reasons for effecting the present invention.

Each of the blocks connects to an intermediate I/O line, such as intermediate I/O line 26, extending from subarray S(DQ4), block C. Data received at the data in buffers 22 eventually pass over these intermediate I/O lines when being written to the subarrays or when being read from the subarrays. Each of subarrays S(DQ0) through S(DQ7) has two intermediate I/O lines because each has 2 blocks. Subarray S(DQ8) connects to 8 intermediate I/O lines because it has 8 blocks.

This is an idealized depiction to simplify the explanation of the claimed invention; in the actual part, the blocks A and E connect to one I/O line and the blocks B and F connect to one I/O line while each of blocks C, G, D and H connect to one I/O line. This six-I/O line connection scheme results from the particular addressing and sense amplifier arrangement implemented in the part.

In normal operation of memory part 10, the respective data bits D0 through D8 written to memory part 10 becomes stored in their respected addressed locations in each of arrays S(DQ0) through S(DQ8). Likewise, data bits Q0 through Q8 read from memory part 10 are read from their respective addressed locations in each of subarrays S(DQ0) through S(DQ8). Internal connection of the row addressing leads, column leads and intermediate I/O lines accounts for the differences between the physical arrangement of subarray S(DQ8) and subarrays S(DQ0) through S(DQ7). In particular, data read from the subarrays S(DQ0) through S(DQ8) pass through the multiplexer circuits 28 before being output by the data out buffers 24. Multiplexer circuits 28 in particular account for the differences between the arrangement of the subarrays in both the normal and test modes of operation.

Memory part 10 also furnishes test mode circuits 30 connected to the address in buffers 20 by lead 32 and connected to a test pad 34 by a lead 36. Memory part 10 can be placed in the test mode by placing voltage Vdd on test pad 34 before encapsulation or by entering a certain address key, such as C3HEX, in a test condition known as a WCBR test cycle. The WCBR test cycle is indicated by the Write_ and CAS_ signals going low before RAS_ goes low. Upon entering the test mode, the test mode circuits 30 produce desired signals on leads 38 extending from the test mode circuits to the data in buffers 22, the data out buffers 24 and the multiplexer circuits 28.

Figure 2:
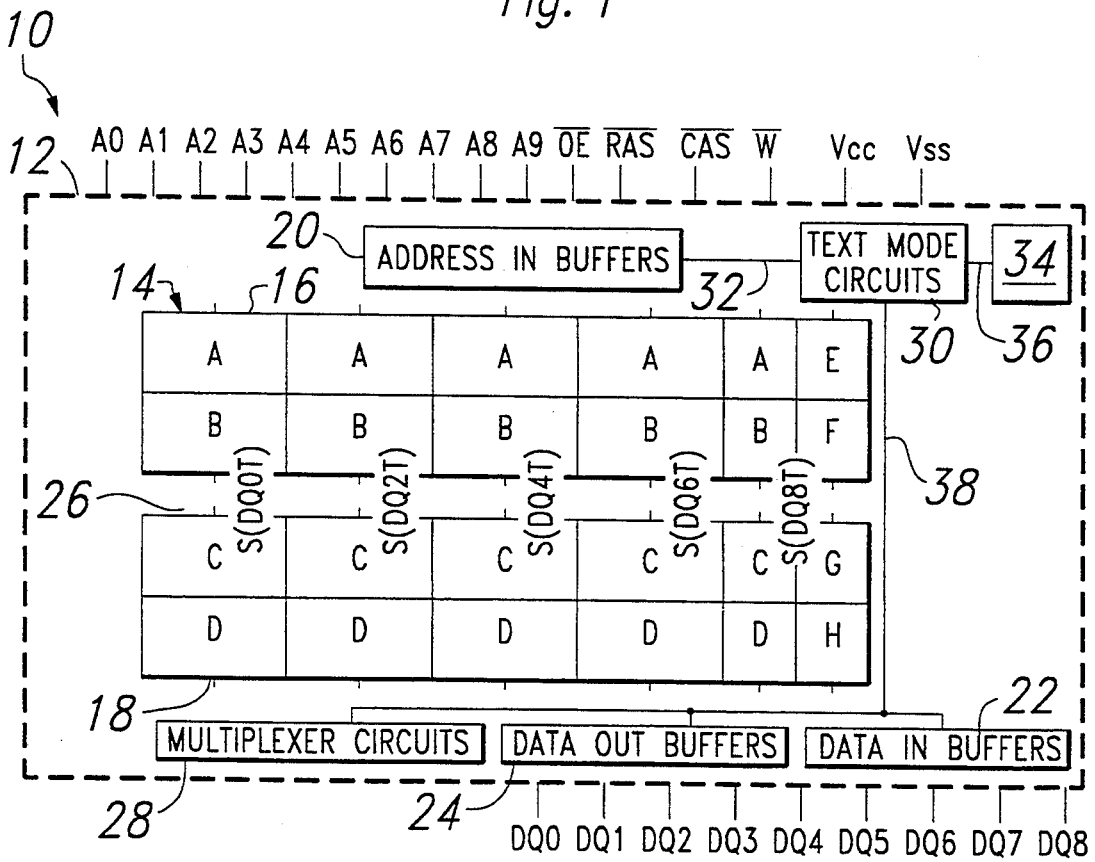
FIG. 2 is another idealized block diagram of the same semiconductor integrated circuit memory part incorporating the present invention and depicting another bitmapped representation of the memory array.

In FIG. 2, entering the test mode effectively reconfigures the device to appear to have a 1 megabit word by 5 bit per word bit map arrangement. This reconfigures the architecture to be basically the same as a commodity X 4 part with each quadrant being assigned one output line. Thus new subarray S(DQ0T) combines previous subarrays S(DQ0T) and S(DQ4). New subarray S(DQ2T) combines previous subarrays S(DQ1) and S(DQ5). New subarray S(DQ4T) combines previous subarrays S(DQ2) and S(DQ6), and new subarray S(DQ6T) combines previous subarrays S(DQ3) and S(DQ6). New subarray S(DQ8T) remains the same as previous subarray S(DQ6). Subarray DQ8T presents ½ megabits of addressable memory locations and looks like the lower ½ of the addressable locations of a normal quadrant in the test mode. The change in apparent configuration occurs through test mode circuits 30 effecting a change in the multiplexer circuits 28 and in the data in buffers 22.

The memory part 10 provides 2 different sets of multiplexers or decoders in multiplexer circuits 28. One set of multiplexers circuits operates in the normal operation and the other set of multiplexer circuits operates during the test mode. The signals from test mode signals 30 control the changes between these two sets of multiplexer circuits.

Figure 3:
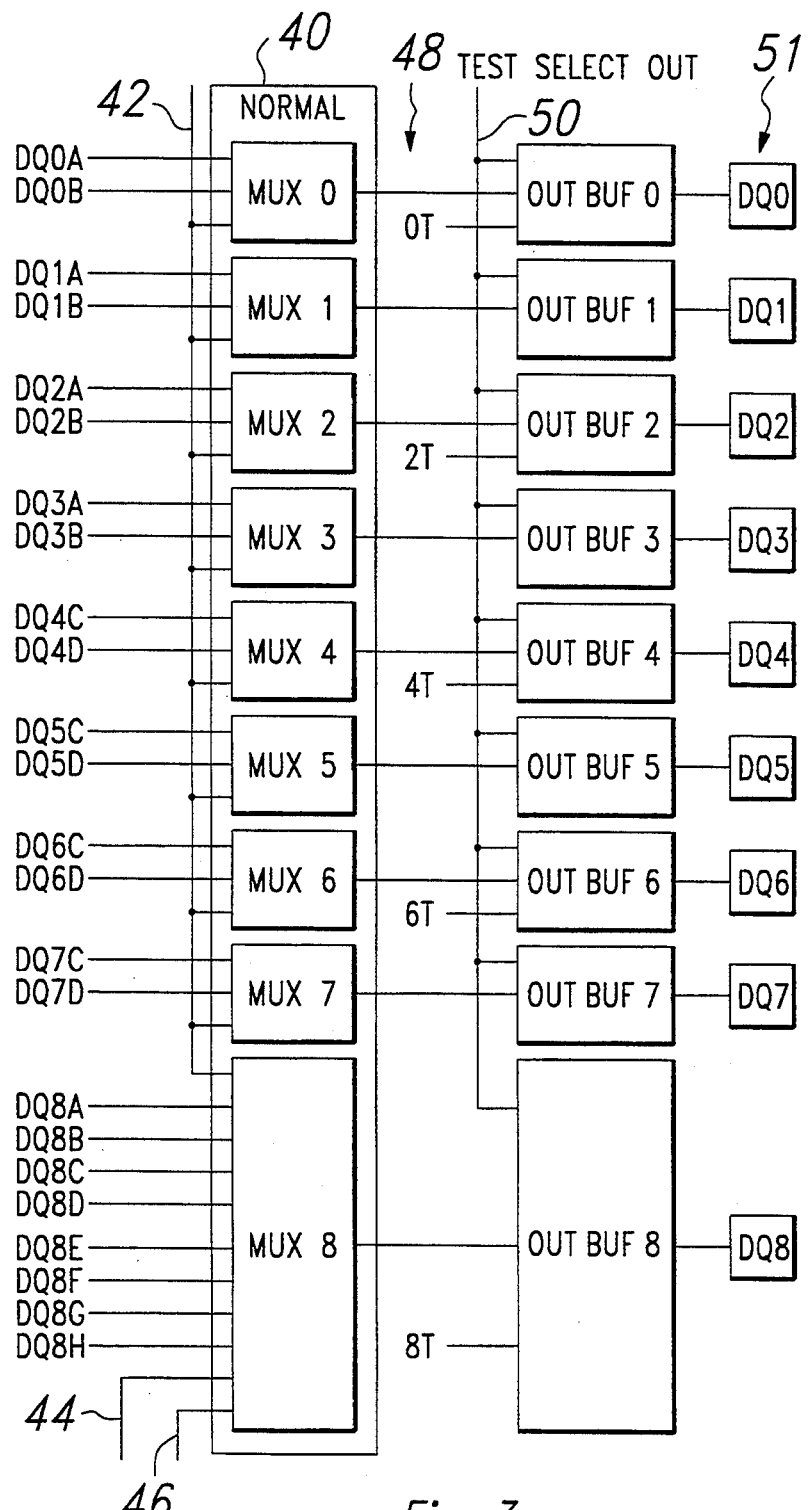
FIG. 3 is a block diagram of a first multiplexer or decoder used in normal operation of the part.

In FIG. 3, the multiplexer circuits 40 for normal operation occur between the intermediate I/O lines DQ0A through DQ8H and output buffers 0 through 8. Address lead 42 connects to each multiplexer MUX0 through MUX7 to select between the A and B intermediate I/O lines from subarrays S(DQ0) through S(DQ7) depicted in FIG. 1. Address lead 42 also connects to multiplexer MUX8 as do address leads 44 and 46. Multiplexer MUX8 uses these three address leads to select between intermediate I/O lines DQ8A through DQ8H. The outputs of the normal multiplexer circuits 40 pass across leads 48 to the respective output buffers.

A test mode select signal extends on lead 50 to each of output buffers BUF0, BUF2, BUF4, BUF6 and BUF8, but not to the odd numbered output buffers. Test mode select signal on lead 50 causes the even numbered output buffers, BUF0, BUF2, BUF4, BUF6, and BUF8 to select between the respective outputs of the normal outputs of the normal multiplexer circuits and the signals occurring on leads 0T, 2T, 4T, 6T, and 8T. The odd numbered output buffers, when receiving the test mode select signal produce a tri-state output. When receiving the test mode select signal, the even numbered output buffers produce data signals corresponding to the data signals received at the 0T, 2T, 4T, 6T, and 8T inputs. In normal operation, the output buffers 0 through 8 produce respective outputs S(DQ0) through S(DQ8) to bond pads 51 depending upon the logical states of the outputs from MUXs 0 trough 8 of normal multiplexer circuits 40.

Figure 4:
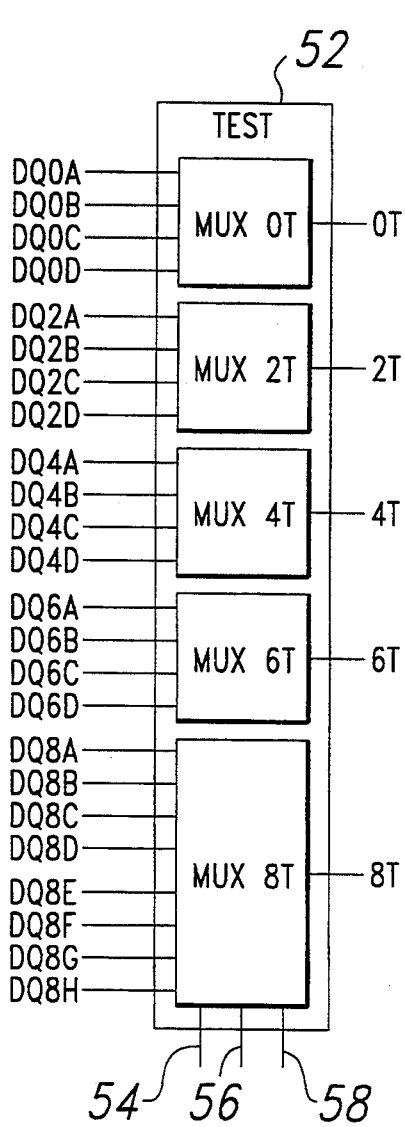
FIG. 4 is a block diagram of a second multiplexer or decoder used in the test mode.

In FIG. 4, multiplexer test circuits 52 contain multiplexer circuits MUX0T MUX2T, MUX4T, MUX6T and MUX8T. Test multiplexer circuits 52 receive address signals on leads 54, 56, and 58, connected to each of the multiplexers circuits, to select between the data signals on the intermediate I/O lines DQ0A through DQ8H in producing respective output signals 0T, 2T, 4T, 6T, and 8T.

In FIGS. 3 and 4, multiplexer circuits 40 and 52 operate in a pass through mode where the outputs always reflect the inputs selected by the respective address signals. Alternatively, test mode circuits 30 could also provide test mode select signals to the normal multiplexer circuits 40 and the test multiplexer circuits 52 to cause their output signals to be tri-state when the other multiplexer circuits are active. Providing the test mode select signals to the normal MUX circuits 40 and the test multiplexer circuits 52 could also reduce power otherwise consumed by these circuits.

Figure 5:
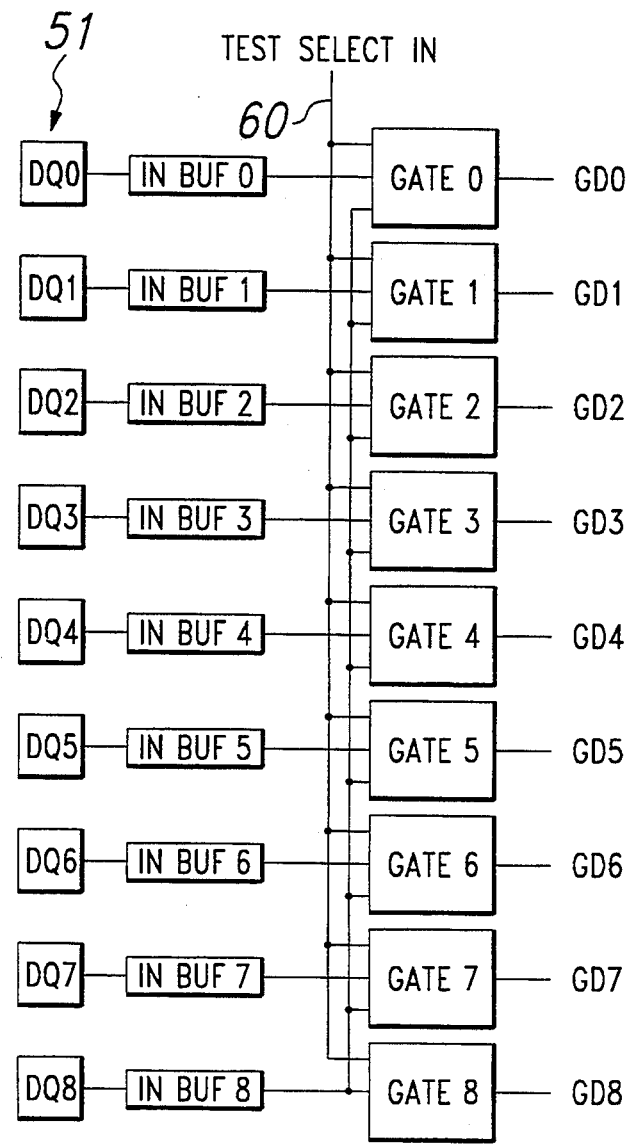
FIG. 5 is a block diagram of the data input circuits of the part.

In FIG. 5, input data bits DQ0 through DQ8 from bond pads 51 are written to memory part 10 through input buffers IN BUF0 through 8 to gates 0 through 8, respectively. The output of IN BUF8 also connects as an input to each of gates 0 through 7. A test select signal appears on lead 60 and extends to each of gates 0 through 8. In normal operation, the outputs of each of gates 0 through 8, which produce signals GD0 through GD8 to memory array 14, reflect the states of the data leads D0 through D8, respectively. In the test mode, an active test select signal on leads 60 causes gates 0 through 7 to output the logical state output by IN BUF8. Thus a single data signal written on data lead D8 becomes written on all of the internal data leads GD0 through GD8.

In the test mode, memory part 10 thus uses only one input signal and five output signals to test the entire memory array of 14. This reduces the number of input pins and output pins required for testing without losing any information concerning test of the memory array 14 and obtaining parallelism in testing the subarrays. Using fewer input and output pins for testing provides the capability of the test fixture testing more memory parts at one time than was previously possible. Effectively this allows greater parallelism in testing at the test station.

Although subarray S(DQ8T) contains only half of the addressable locations of the other subarrays S(DQ0T), S(DQ2T), S(DQ4T) and S(DQ6T), DQ4T and DQ6T, the same test pattern in the test mode, can be applied in parallel to all five arrays. Data read from the non-existent upper ½ of subarray S(DQ8T) always appears at Data Out lead D8 as a certain logic state, and as logic state "0".

By changing the apparent bit map of the memory array 14 into 5 subarrays from 9 subarrays, the test fixture can use the same test pattern for all subarrays. This avoids having to use different test patterns for subarrays S(DQ0) through S(DQ7) and a different set of test patterns for subarray S(DQ8).

While the present device is configured in rows and columns as has been previously explained with desired row and column address leads, the specific configuration of the subarrays can be changed while remaining within the scope of the claimed invention.

I claim:

1. A semiconductor integrated circuit memory part comprising:
   A. an array of memory cells divided into a plurality of subarrays of memory cells;
   B. a plurality of data input leads for receiving data to be written into the memory array, one data input lead being coupled to each subarray;
   C. a plurality of data output leads for sending data read from the memory array, one data output lead being coupled to each subarray;
   D. first data paths between the data input leads and the memory array and between the memory array and the data output leads for normal operation of the part using all of the data input and data output leads; and
   E. second data paths between the data input leads and the memory array and between the memory array and the data output leads for testing the part using less than all of the data input and data output leads.

2. The memory part of claim 1 including one set of multiplexer circuits connected in one arrangement between the memory subarrays and the data output leads for use in normal operation of the memory part and another set of multiplexer circuits connected in another arrangement between the memory subarrays and the data output leads for use in a test mode of operation of the memory part, the one and the other connection arrangements being different from one another.

3. The memory part of claim 1 including test mode circuits responsive to a predetermined signal, the test mode circuits providing test mode signals in response to said predetermined signal, the test mode signals selecting the operation of the memory part between the first and second data paths.

4. The memory part of claim 1 including one set of multiplexer circuits connected in one arrangement between the memory subarrays and the data output leads for use in normal operation of the memory part and another set of multiplexer circuits connected in another arrangement between the memory subarrays and the data output leads for use in a test mode of operation of the memory part, the one and the other connection arrangements being different from one another, the memory part also including test mode circuits responsive to a predetermined signal, the test mode circuits providing signals in response to the predetermined signal which select the operation of the one and the other multiplexer circuits.

5. The memory part of claim 1 including test mode circuits responsive to predetermined address signals, the predetermined address signals causing the test mode circuits to provide test signals which select operation of the memory part between the first and the second paths.

6. The memory part of claim 1 including test mode circuits responsive to a voltage on a test pad of the test mode circuits, the voltage resulting in signals from the test mode circuits selecting the operation of the memory part between the first and the second paths.

7. The memory part of claim 1 including gating circuits connected between the data input leads and the memory array to apply the data received on one data input lead to all of the subarrays.

8. The memory part of claim 1 in which the plurality of subarrays have unlike arrangements.

* * * * *